(12) United States Patent
Molina et al.

(10) Patent No.: US 11,271,578 B2
(45) Date of Patent: Mar. 8, 2022

(54) TIME-INTERLEAVED ANALOG-TO-DIGITAL CONVERTER SYSTEM

(71) Applicant: Intel Corporation, Santa Clara, CA (US)

(72) Inventors: Albert Molina, Novelda (ES); Kameran Azadet, San Ramon, CA (US); Matteo Camponeschi, Villach (AT); Jose Luis Ceballos, Villach (AT); Christian Lindholm, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/059,495

(22) PCT Filed: Mar. 29, 2019

(86) PCT No.: PCT/US2019/024789
§ 371 (c)(1),
(2) Date: Nov. 30, 2020

(87) PCT Pub. No.: WO2020/159559
PCT Pub. Date: Aug. 6, 2020

(65) Prior Publication Data
US 2021/0367607 A1 Nov. 25, 2021

Related U.S. Application Data

(60) Provisional application No. 62/798,505, filed on Jan. 30, 2019.

(51) Int. Cl.
*H03M 1/12* (2006.01)
*H03M 1/06* (2006.01)
*H03M 1/10* (2006.01)

(52) U.S. Cl.
CPC ....... *H03M 1/1215* (2013.01); *H03M 1/0697* (2013.01); *H03M 1/1038* (2013.01)

(58) Field of Classification Search
CPC . H03M 1/1215; H03M 1/0697; H03M 1/1038
(Continued)

(56) References Cited

U.S. PATENT DOCUMENTS 7,916,050 B1 * 3/2011 Mujica .................. H03M 1/004
341/118
8,928,507 B2 * 1/2015 Taluja ................. H03M 1/1038
341/118

(Continued)

FOREIGN PATENT DOCUMENTS

KR 101735582 B1 5/2017
KR 101838298 B1 3/2018

OTHER PUBLICATIONS

Antoine Bonnetat et al.:"An Adaptive All-Digital Blind Compensation of Dual-TIADC Frequency-Response Mismatch Based on Complex Signal Correlations", IEEE Transactions on Circuits and Systems II: Express Briefs, vol. 62, No. 9, Sep. 2015, pp. 821-825.

(Continued)

*Primary Examiner* — Khai M Nguyen
(74) *Attorney, Agent, or Firm* — 2SPL Patent Attorneys PartG mbB; Kieran O'Leary

(57) ABSTRACT

A time-interleaved Analog-to-Digital Converter, ADC, system is provided. The time-inter-leaved ADC system includes time-interleaved first and second ADC circuits and a switching circuit. The switching circuit is configured to selectively supply an analog input signal for digitization to at least one of the first ADC circuit, the second ADC circuit or ground, and to selectively supply an analog calibration signal to at least one of the first ADC circuit, the second ADC circuit or ground. Further, the time-interleaved ADC system includes an output circuit configured to selectively generate, based on
(Continued)

least one of a first digital signal output by the first ADC circuit and a second digital signal output by the second ADC circuit, a digital output signal.

25 Claims, 4 Drawing Sheets

(58) Field of Classification Search
USPC .......................................... 341/118, 120, 155
See application file for complete search history.

(56) References Cited

U.S. PATENT DOCUMENTS

| 2014/0009318 A1 | 1/2014 | Taluja et al. |
| 2015/0326240 A1 | 11/2015 | Tousi et al. |
| 2016/0079994 A1 | 3/2016 | Lee et al. |

OTHER PUBLICATIONS

Shuai Chen et al.:"AII-Digital Calibration of Timing Mismatch Error in Time-Interleaved Analog-to-Digital Converters", IEEE Transactions on Very Large Scale Integration (VLSI) Systems, vol. 25, No. 9, Sep. 2017, pp. 2552-2560.

Manar El-Chammas et al.:"A 12-GS/s 81-mW 5-bit Time-Interleaved Flash ADC With Background Timing Skew Calibration", IEEE Journal of Solid-State Circuits; vol. 46, No. 4, Apr. 2011, pp. 838-847.

Manar El-Chammas:"Background Calibration of Timing Skew in Time-Interleaved A/D Converters", A dissertation submitted to the Department of Electrical Engineering and the Committee on Graduate Studies of Standford University in partial fulfillment of the requirements for the degree of doctor of philosophy, Aug. 2010.

Han Le Duc et al.:"All-Digital Calibration of Timing Skews for TIADCs Using the Polyphase Decomposition", IEEE Transactions on Circuits and Systems II: Express Briefs, vol. 63, No. 1, Jan. 2016, pp. 99-103.

Hamidreza Mafi et al.:"Digital Blind Background Calibration of Imperfections in Time-Interleaved ADCs", IEEE Transactions on Circuits and Systems I: Regular Papaers, vol. 64, No. 6, Jun. 2017, pp. 1504-1513.

Behzad Razavi:"Design Considerations for Interleaved ADCs", IEEE Journal of Solid-State Circuits, vol. 48, No. 8, Aug. 2013, pp. 1806-1817.

* cited by examiner

TIME-INTERLEAVED ANALOG-TO-DIGITAL CONVERTER SYSTEM

This application claims the benefit of priority to U.S. Provisional Application Ser. No. 62/798,505, filed Jan. 30, 2019, which is incorporated by reference in its entirety.

FIELD

The present disclosure relates to analog-to-digital conversion. In particular, examples relate to a Time-Interleaved Analog-to-Digital Converter (TI-ADC) system, a receiver, a base station and a mobile device.

BACKGROUND

A TI-ADC employs several lower speed sub-ADCs operating in parallel in order to achieve a desired aggregate sampling rate. Thus, each sub-ADC may operate at a lower speed compared to when a single ADC would be used. Differences amongst sub-ADCs (e.g. caused by manufacturing tolerances) result in degraded performance in terms of noise Power Spectral Density (nPSD) and/or Spurious Free Dynamic Range (SFDR). Calibration is required in order to remove these undesired performance-degrading effects. Typical mismatches amongst the sub-ADCs include: DC offset, gain, timing skew/mismatch, frequency response and other nonlinear mismatches.

Many applications, demand a large SFDR and a low nPSD. A $3^{rd}$ Generation Partnership Project (3GPP) standardized base station receiver may be one such application. This application demands very accurate sub-ADC alignment or mismatch reduction or cancellation of all the types of mismatches mentioned above. In order to achieve this high accuracy, it is beneficial to take the TI-ADC offline (e.g. by decoupling its input signal), calibrate it (e.g. while the input signal is decoupled) and then bring it back online (e.g. by coupling the input signal again to the ADC). In the case of 3GPP Frequency-Division Duplex (FDD) carriers, the ADC cannot be taken offline for calibration.

Hence, there may be a desire for an improved TI-ADC architecture.

BRIEF DESCRIPTION OF THE FIGURES

Some examples of apparatuses and/or methods will be described in the following by way of example only, and with reference to the accompanying figures, in which.

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two Elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including", when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
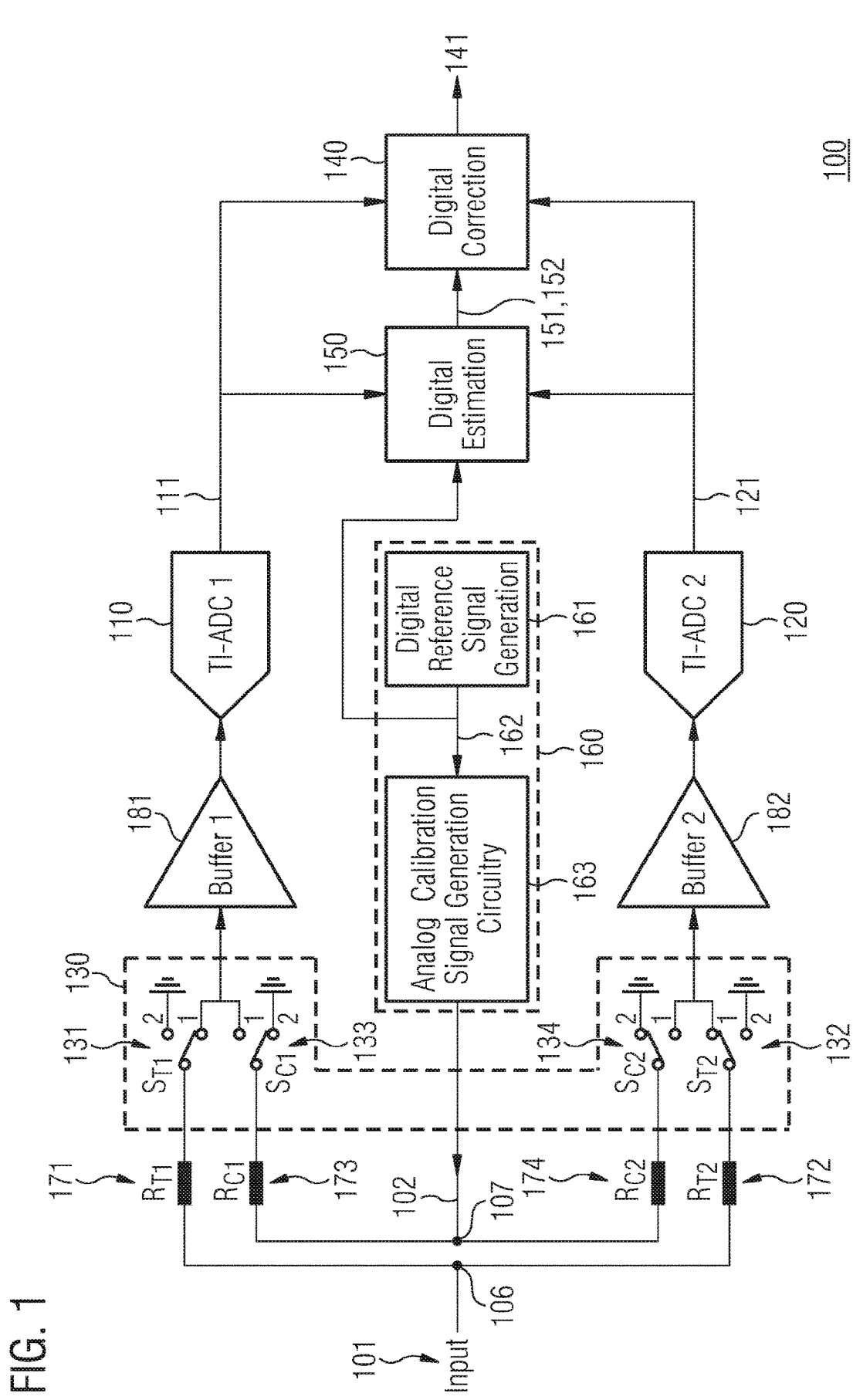
FIG. 1 illustrates an example of a TI-ADC system.

FIG. 1 illustrates an example of a TI-ADC system 100 that may allow improved TI-ADC calibration. The TI-ADC system 100 comprises time-interleaved first and second ADC circuits 110 and 120. The first and second ADC circuits 110 and 120 may be understood as ADC channels or sub-ADCs of the TI-ADC system 100. An ADC circuit of the TI-ADC system 100 may, e.g., be a Successive Approximation Register (SAR) ADC, a flash ADC (also referred to as direct conversion ADC), a pipeline ADC, a sigma-delta ADC or a time-interleaved ADC itself. If an ADC circuit is a time-interleaved ADC itself, it may comprise at least two sub-ADC circuits. A sub-ADC circuit may, e.g., be a SAR ADC, a flash ADC, a pipeline ADC or a sigma-delta ADC.

That is, the complete TI-ADC system 100 is divided into two ADC circuits 110 and 120. For example, if an overall (total) sample rate (sample frequency, sampling frequency) of the TI-ADC system 100 is $F_s$ (e.g. several Giga-Samples Per Second, GSPS), each of the ADC circuits 110 and 120 may sample a respective input signal at a sample rate $F_s/2$.

The TI-ADC system 100 comprises an input node 106 configured to receive an analog (e.g. Radio Frequency, RF) input signal 101 for digitization. Further, the TI-ADC system 100 comprises a signal node 107 configured to receive an analog calibration signal 102. The TI-ADC system 100 additionally comprises a switching circuit 130 coupled to the input node 106 and the signal node 107. The switching circuit 130 is configured to selectively supply the analog input signal 101 to at least one of the first ADC circuit 110, the second ADC circuit 120 or ground. Further, the switching circuit 130 is configured to selectively supply an analog calibration signal 102 to at least one of the first ADC circuit 110, the second ADC circuit 120 or ground.

Additionally, the TI-ADC system 100 further comprises an output circuit 140 configured to selectively generate a digital output signal 141 based on least one of a first digital signal 111 output by the first ADC circuit 110 and a second digital signal 121 output by the second ADC circuit 120.

A parameter determination circuit 150 of the TI-ADC system 100 is configured to selectively determine at least one of first correction parameters 151 for the output circuit 140 for correcting the first digital signal and second correction parameters 152 for the output circuit 140 for correcting the second digital signal.

The switching circuit 130 may allow to take either one of the two time-interleaved ADC circuits 110 and 120 or both time-interleaved ADC circuits 110 and 120 offline for calibration. Therefore, the TI-ADC system 100 may support various, also complex, offline calibrations.

For example, the TI-ADC system 100 using the proposed TI-ADC calibration technique may be used for systems operating in a Time-Division Duplex (TDD) mode for input signals exhibiting frequencies up to $F_S/2$, or for systems operating in a FDD mode for input signals exhibiting frequencies up to $F_S/4$. This applies, e.g., to a wideband base-station receiver for 3GPP bands, where an exemplary uplink FDD band is band 22 (from 3410 to 3490 MHz) and TDD bands for $5^{th}$ Generation New Radio (5G NR) below 6 GHz, if the overall sample rate of the TI-ADC system 100 is set to 15.73 GSPS (which is a multiple of 30.72 MHz and, hence, a suitable sample rate for wideband 3GPP receivers). However, it is to be noted the foregoing numbers are illustrative and, hence, not limiting the sample rate and the proposed architecture. Other frequencies and sample rates may be used as well (e.g. related to mm wave bands).

For example, if the TI-ADC system 100 is used in a base station operating in a FDD mode and the highest FDD input signal exhibits a frequency below $F_S/4$, only one half of the TI-ADC system 100 is needed to sample the FDD input signal while offline calibration of the spare half of the TI-ADC system may be performed (e.g. at the same time). Then, it may, e.g., be ping-ponged between the two TI-ADC halves (e.g. the first half may be used for processing the input signal, while the second half is calibrated in parallel; and vice versa to calibrate the first half while the second half is used for processing the input signal) or the recently calibrated half may be used as a reference to calibrate the half that is sampling the input signal. If the TI-ADC system 100 is used in a base station operating in a TDD mode, either one half or the full TI-ADC system 100 may be used for processing a TDD input signal. The TI-ADC system 100 may be calibrated while the sub-section of the base station comprising the TI-ADC is transmitting and, hence, no data is received by this sub-section. Optionally, the FDD calibration techniques may be used for TDD calibration.

Some exemplary calibration schemes will be described below in detail.

In the example of FIG. 1, the switching circuit 130 comprises a first switch 131 configured to selectively couple the input node 106 to the first ADC circuit 110 or ground. Further, the switching circuit 130 comprises a second switch 132 configured to selectively couple the input node 106 to the second ADC circuit 120 or ground. Similarly, the switching circuit 130 comprises a third switch 133 configured to selectively couple the signal node 107 to the first ADC circuit 110 or ground, and a fourth switch 134 configured to selectively couple the signal node 107 to the second ADC circuit 120 or ground. For example, the first to fourth switches may be analog switches such as Metal-Oxide-Semiconductor (MOS) transistors. It is to be noted that the implementation of the switching circuit 130 illustrated in FIG. 1 is merely exemplary. The proposed architecture is not limited to the implementation illustrated in FIG. 1. In general, any means capable of performing the switching functionalities described herein in connection with the switching circuit 130 may be used.

The exemplary TI-ADC system 100 additionally comprises a first resistive element 171 coupled between the input node 106 and the first switch 131, and a second resistive element 172 coupled between the input node 106 and the second switch 132. Similarly, the TI-ADC system 100 comprises a third resistive element 173 coupled between the signal node 107 and the third switch 133, and a fourth resistive element 174 coupled between the signal node 107 and the fourth switch 134. The first to fourth resistive elements act as termination resistances.

Further illustrated are a first buffer circuit 181 coupled between the switching circuit 130 and the first ADC circuit 110, and a second buffer circuit 182 coupled between the switching circuit 130 and the second ADC circuit 120. The buffer circuits 181 and 182 act as input buffers for buffering input signals for the ADC circuits 110 and 120. In other words, each of the ADC circuits 110 and 120 is driven by an input buffer. It may be assumed that the impedance of the buffer circuits 181 and 182 is substantially zero (as it is for the ground terminals) so that the impedance seen from the input node 101 is constant and, hence, independent of the switch setting (position) of the first and second switches 131 and 132.

In the example of FIG. 1, the TI-ADC system 100 further comprises a signal generation circuit 160 configured to generate the analog calibration signal 102. The signal generation circuit 160 comprises a digital calibration circuit 161 (e.g. a Digital Signal Processor, DSP) configured to generate a digital calibration signal 162 representing one or more digital data sequences for calibration. Further, the signal generation circuit 160 comprises an analog signal generation circuit 163 configured to generate the analog calibration signal 102 based on the one or more digital data sequences for calibration. For example, the analog signal generation circuit 163 may comprise a one or more Digital-to-Analog Converters (DACs), one or more filters, one or more oscillators, etc. for generating the analog calibration signal 102 based on the digital data.

The output circuit 140 generates the digital output signal 141 based on at least one of the first digital signal 111 and the second digital signal 121 using the first correction parameters 151 for the first digital signal 111 and the second correction parameters 152 for the second digital signal 121. In other words, the output circuit 140 takes the parameters from the parameter determination circuit 150 and the output of at least one of the ADC circuits 110 and 120 for generating the digital output signal 141, which is corrected for mismatches between the ADC circuits 110 and 120 (e.g. DC offset, timing skew, gain, etc.). As indicated above, the purpose of the parameter determination circuit 150 is to estimate (determine) the correction parameters for the output circuit 140.

The output terminals of the first to fourth switches 131, . . . , 134 are connected to either the input buffers or to ground. An overview of exemplary switch setting for the first to fourth switches 131, . . . , 134 is given in below Table 1. For setting two, the switches couple the respective one of the analog input signal and the digital output signal to ground. For setting one, the switches couple the respective one of the analog input signal and the digital output signal to the associated ADC circuit (e.g. the first switch 131 to the first ADC circuit 110).

TABLE 1

| Setting Number | Description | overall Sample Rate | first switch setting | second switch setting | third switch setting | fourth switch setting |
|---|---|---|---|---|---|---|
| 1 | TDD Receive | $F_s$ | 1 | 1 | 2 | 2 |
| 2 | TDD Calibrate | $F_s$ | 2 | 2 | 1 | 1 |
| 3 | TDD Receive | $F_s/2$ | 1 | 2 | 2 | 2 |
| 4 | TDD Calibrate | $F_s/2$ | 2 | 2 | 1 | 2 |
| 5 | FDD Ping | $F_s/2$ | 1 | 2 | 2 | 1 |
| 6 | FDD Pong | $F_s/2$ | 2 | 1 | 1 | 2 |
| 7 | FDD Calibrate Ref | $F_s/2$ | 1 | 2 | 2 | 1 |
| 8 | FDD Calibrate Rx | $F_s/2$ | 1 | 1 | 2 | 2 |

A first calibration scheme comprises two operation modes of the TI-ADC system 100. The two operation modes correspond to settings number 1 and 2 of above Table 1.

In the first operation mode, the switching circuit 130 is configured to (simultaneously) supply the analog input signal 101 to the first ADC circuit 120 and the second ADC circuit 120. Further, the switching circuit 130 is configured to supply the analog calibration signal 102 to ground in the first operation mode. Therefore, the first and second switches 131 and 132 couple the analog input signal 101 to the first ADC circuit 110 and the second ADC circuit 120, whereas the third and fourth switches 133 and 134 couple the digital output signal 102 to ground.

The output circuit 140 is configured to generate the digital output signal 141 based on the first digital signal 111 and the second digital signal 121 in the first operation mode. For generating the digital output signal 141, the output circuit 140 uses the stored (e.g. previously determined) first and second correction parameters 151 and 152.

For example, the output circuit 140 may be configured to generate the digital output signal 141 at the maximum sample rate $F_s$ of the TI-ADC system 100. In accordance with the Nyquist-Shannon sampling theorem, a frequency of the analog input signal 101 may be up to (i.e. less than or equal to) half of the maximum sample rate $F_s$ of the TI-ADC system 100.

In the second operation mode, the switching circuit 130 is configured to (simultaneously) supply the analog calibration signal 102 to the first ADC circuit 110 and the second ADC circuit 120. Further, the switching circuit 130 is configured to supply the analog input signal 101 to ground in the second operation mode. Therefore, the first and second switches 131 and 132 couple the analog input signal 101 to ground, whereas the third and fourth switches 133 and 134 couple the digital output signal 102 to the first ADC circuit 120 and the second ADC circuit 120.

The parameter determination circuit 150 is configured to determine (re-determine, update) the first and second correction parameters 151 and 152 based on the first digital signal 111, the second digital signal 121 and a signal related to the analog calibration signal 102 in the second operation mode. As described above, the analog calibration signal 102 is derived from the digital calibration signal 162 representing the one or more digital data sequences for calibration. Therefore, the signal related to the analog calibration signal 101 is the digital calibration signal 162 in the example of FIG. 1.

In the first calibration scheme, the analog input signal 101 is digitized by the TI-ADC system 100 in the first operation mode, whereas the TI-ADC system 100 is calibrated in the second operation mode. Therefore, the first calibration scheme may, e.g., be used in systems operating in a TDD mode for input signals up to a maximum frequency of $F_s/2$. The first operation mode of the TI-ADC system 100 may be understood as a receive mode of the TI-ADC system 100, whereas the second operation mode of the TI-ADC system 100 may be understood as a calibration mode of the TI-ADC system 100 while the TDD system is transmitting.

In other words, the first to fourth switches 131, . . . , 134 adopt setting number 1 in the first operation mode so that the analog input signal 101 (e.g. a RF input signal) is fed to both input buffers 181 and 182 of the TI-ADC system 100, whereas the analog calibration signal 102 is terminated to ground. The output circuit 140 takes the correction parameters from the parameter determination circuit 150 (e.g. determined during a previous operation in the second operation mode, i.e. a previous calibration) and the two ADC circuit outputs in order to generate the corrected digital output signal 141 at the sample rate $F_s$. Further, the first to fourth switches 131, . . . , 134 adopt setting number 2 in the second operation mode so that the analog calibration signal 102 is fed to both input buffers 181 and 182 of the TI-ADC system 100, whereas the analog input signal 101 is terminated to ground. The parameter determination circuit 150 estimates the correction parameters for the output circuit 140 from the two ADC circuit outputs.

A second calibration scheme comprises two operation modes of the TI-ADC system 100. The two operation modes correspond to settings number 3 and 4 of above Table 1.

In the first operation mode, the switching circuit 130 is configured to exclusively supply the analog input signal 101 to the first ADC circuit 110 among the time-interleaved first and second ADC circuits 110 and 120. Further, the switching circuit 130 is configured to supply the analog calibration signal 102 to ground in the first operation mode. Therefore, the first switch 131 couples the analog input signal 101 to the first ADC circuit 110, whereas the second switch 132 couples the analog input signal 101 to ground. The third and fourth switches 133 and 134 couple the digital output signal 102 to ground.

The output circuit 140 is configured to generate the digital output signal 141 based on exclusively (only) the first digital signal 111 (and not based on the second digital signal 121). For generating the digital output signal 141, the output circuit 140 uses the stored (e.g. previously determined) first correction parameters 151.

For example, the output circuit 140 may be configured to generate the digital output signal 141 at (about) half of the maximum sample rate $F_s$ of the TI-ADC system 100. In accordance with the Nyquist-Shannon sampling theorem, a frequency of the analog input signal 101 may be up to (i.e. less than or equal to) quarter of the maximum sample rate $F_s$ of the TI-ADC system 100.

In the second operation mode, the switching circuit 130 is configured to exclusively supply the analog calibration signal 102 to the first ADC circuit 110 among the time-interleaved first and second ADC circuits 110 and 120. Further, the switching circuit 130 is configured to supply the analog input signal 101 to ground in the second operation mode. Therefore, the first and second switches 131 and 132 couple the analog input signal 101 to ground. The third switch 133 couples the analog calibration signal 102 to the first ADC circuit 110, whereas the fourth switch 134 couples the analog calibration signal 102 to ground.

The parameter determination circuit 150 is configured to determine (re-determine, update) exclusively (only) the first correction parameters 151 based on the first digital signal 111 and a signal related to the analog calibration signal 101. As described above, the analog calibration signal 102 is derived from the digital calibration signal 162 representing the one or more digital data sequences for calibration. Therefore, the signal related to the analog calibration signal 101 is the digital calibration signal 162 in the example of FIG. 1. The parameter determination circuit 150 does not determine the second correction parameters 152 in the second operation mode.

In the second calibration scheme, the analog input signal 101 is digitized by only the first ADC circuit 110 of the TI-ADC system 100 in the first operation mode, whereas the first ADC circuit 110 of the TI-ADC system 100 is calibrated in the second operation mode. Therefore, the second calibration scheme may, e.g., be used in systems operating in a TDD mode for input signals up to a maximum frequency of $F_s/4$. The first operation mode of the TI-ADC system 100 may be understood as a receive mode of the TI-ADC system 100, whereas the second operation mode of the TI-ADC system 100 may be understood as a calibration mode of the TI-ADC system 100 while the TDD system is transmitting.

In other words, the first to fourth switches 131, . . . , 134 adopt setting number 3 in the first operation mode so that the analog input signal 101 (e.g. an RF input signal) is fed to the input buffer 181 of the TI-ADC system 100, whereas the analog calibration signal 102 is terminated to ground. The output circuit 140 takes the correction parameters from the parameter determination circuit 150 (e.g. determined during a previous operation in the second operation mode, i.e. a previous calibration) and the ADC circuit 110's output in order to generate the corrected digital output signal 141 at the sample rate $F_s/2$. Further, the first to fourth switches 131, . . . , 134 adopt setting number 4 in the second operation mode so that the analog calibration signal 102 is fed to input buffer 181 of the TI-ADC system 100, whereas the analog input signal 101 is terminated to ground. The parameter determination circuit 150 estimates the correction parameters for the output circuit 140 from the ADC circuit 110's output.

In the above exemplary second calibration scheme, only the first ADC circuit 110 is calibrated. However, it is to be noted that the second calibration scheme may be used mutatis mutandis for calibrating the second ADC circuit 120. For example, if used in a system operation in a TDD mode, the first ADC circuit 110 may be calibrated in a first transmission period of the system and the second ADC circuit 120 may be calibrated in a subsequent second transmission period of the system based on the principles of the second calibration scheme.

A third calibration scheme comprises two operation modes of the TI-ADC system 100. The two operation modes correspond to settings number 5 and 6 of above table 1.

In the first operation mode, the switching circuit 130 is configured to (simultaneously) supply the analog input signal 101 to the first ADC circuit 110 and the analog calibration signal 102 to the second ADC circuit 120. Therefore, the first switch couples the analog input signal 101 to the first ADC circuit 110, whereas the second switch 132 couples the analog input signal 101 to ground. The fourth switch 134 couples the analog calibration signal 102 to the second ADC circuit 120, whereas the third switch 133 couples the analog calibration signal 102 to ground.

The output circuit 140 is configured to generate the digital output signal 141 based on exclusively (only) the first digital signal 111. For generating the digital output signal 141, the output circuit 140 uses the stored (e.g. previously determined) first correction parameters 151.

The parameter determination circuit 150 is configured to determine (re-determine, update) exclusively (only) the second correction parameters 152 based on the second digital signal 121 and a signal related to the analog calibration signal 101. As described above, the analog calibration signal 102 is derived from the digital calibration signal 162 representing the one or more digital data sequences for calibration. Therefore, the signal related to the analog calibration signal 101 is the digital calibration signal 162 in the example of FIG. 1. The parameter determination circuit 150 does not determine the first correction parameters 151 in the first operation mode.

In the second operation mode, the switching circuit 130 is configured to (simultaneously) supply the analog input signal 101 to the second ADC circuit 120 and the analog calibration signal 102 to the first ADC circuit 110. Therefore, the second switch 132 couples the analog input signal 101 to second ADC circuit 120, whereas the first switch couples the analog input signal 101 to ground. The third switch 133 couples the analog calibration signal 102 to the first ADC circuit 110, whereas the fourth switch 134 couples the analog calibration signal 102 to ground.

The output circuit 140 is configured to generate the digital output signal based on exclusively (only) the second digital signal 121. For generating the digital output signal 141, the output circuit 140 uses the previously determined second correction parameters 152.

The parameter determination circuit 150 is configured to determine (re-determine, update) exclusively (only) the first correction parameters 151 based on the first digital signal 111 and the signal related to the analog calibration signal. The parameter determination circuit 150 does not determine the first correction parameters 151 in the second operation mode.

For example, the output circuit 140 may be configured to generate the digital output signal 141 at (about) half of the maximum sample rate $F_s$ of the TI-ADC system 100 in both operation modes. In accordance with the Nyquist-Shannon sampling theorem, a frequency of the analog input signal 101 may be up to (i.e. less than or equal to) quarter of the maximum sample rate $F_s$ of the TI-ADC system 100 in both operation modes.

In the third calibration scheme, the analog input signal 101 is digitized by only the first ADC circuit 110 of the TI-ADC system 100 in the first operation mode, whereas the second ADC circuit 120 of the TI-ADC system 100 is calibrated in the first operation mode. In the second operation mode, the analog input signal 101 is digitized by only the second ADC circuit 120 of the TI-ADC system 100, whereas the first ADC circuit 110 of the TI-ADC system 100 is calibrated. Therefore, the first calibration scheme may, e.g., be used in systems operating in a FDD mode for input signals up to a maximum frequency of $F_s/4$. Calibration and input signal processing is ping-ponged between the two ADC circuits 110 and 120. So that the first operation mode of the TI-ADC system 100 may be understood as a pong mode of the TI-ADC system 100, whereas the second operation mode of the TI-ADC system 100 may be understood as ping mode of the TI-ADC system 100.

In other words, the first to fourth switches 131, . . . , 134 adopt setting number 5 in the first operation mode so that the analog input signal 101 (e.g. an RF input signal) is fed to the input buffer 181 of the TI-ADC system 100 and the analog calibration signal 102 is fed to the input buffer 182 of the TI-ADC system 100. The output circuit 140 takes the correction parameters from the parameter determination circuit 150 (e.g. determined during a previous operation in the second operation mode, i.e. a previous calibration) and the ADC circuit 110's output in order to generate the corrected digital output signal 141 at the sample rate $F_s/2$. The parameter determination circuit 150 estimates the correction parameters for the output circuit 140 from the ADC circuit 120's output. Further, the first to fourth switches 131, . . . , 134 adopt setting number 6 in the second operation mode so that the analog calibration signal 102 is fed to input buffer 181 of the TI-ADC system 100 and the analog input signal 101 is fed to the input buffer 182 of the TI-ADC system 100. The output circuit 140 takes the correction parameters from the parameter determination circuit 150 (e.g. determined during the previous operation in the first operation mode, i.e. a previous calibration) and the ADC circuit 120's output in order to generate the corrected digital output signal 141 at the sample rate $F_s/2$. The parameter determination circuit 150 estimates the correction parameters for the output circuit 140 from the ADC circuit 110's output.

A fourth calibration scheme comprises two operation modes of the TI-ADC system 100. The two operation modes correspond to settings number 7 and 8 of above table 1.

In the first operation mode, the switching circuit 130 is configured to (simultaneously) supply the analog input signal 101 to the first ADC circuit 110 and the analog calibration signal 102 to the second ADC circuit 120. Therefore, the first switch couples the analog input signal 101 to the first ADC circuit 110, whereas the second switch 132 couples the analog input signal 101 to ground. The fourth switch 134 couples the analog calibration signal 102 to the second ADC circuit 120, whereas the third switch 133 couples the analog calibration signal 102 to ground.

The output circuit 140 is configured to generate the digital output signal 141 based on exclusively (only) the first digital signal 111. For generating the digital output signal 141, the output circuit 140 uses the stored (e.g. previously determined) first correction parameters 151.

The parameter determination circuit 150 is configured to (re-determine, update) exclusively (only) the second correction parameters 152 based on the second digital signal 121 and a signal related to the analog calibration signal 101. As described above, the analog calibration signal 102 is derived from the digital calibration signal 162 representing the one or more digital data sequences for calibration. Therefore, the signal related to the analog calibration signal 101 is the digital calibration signal 162 in the example of FIG. 1. The parameter determination circuit 150 does not determine the first correction parameters 151 in the first operation mode.

In the second operation mode, the switching circuit 130 is configured to (simultaneously) supply the analog input signal 101 to the first ADC circuit 120 and the second ADC circuit 120. Further, the switching circuit 130 is configured to supply the analog calibration signal 102 to ground in the second operation mode. Therefore, the first and second switches 131 and 132 couple the analog input signal 101 to the first ADC circuit 110 and the second ADC circuit 120, whereas the third and fourth switches 133 and 134 couple the digital output signal 102 to ground.

The output circuit 140 is configured to generate the digital output signal 141 based on exclusively (only) the first digital signal 111. For generating the digital output signal 141, the output circuit 140 uses the stored (e.g. previously determined) first correction parameters 151.

The parameter determination circuit 150 is configured to (re-determine, update) exclusively (only) the first correction parameters 151 based on the first digital signal 111 and the second digital signal 121. That is, the parameter determination circuit 150 determines the first correction parameters 151 using the second digital signal 121 as output by the second ADC circuit 120 as a reference signal for the first digital signal 111 output by the first ADC circuit 110. The parameter determination circuit 150 does not determine the second correction parameters 152 in the second operation mode.

For example, the output circuit 140 may be configured to generate the digital output signal 141 at (about) half of the maximum sample rate $F_s$ of the TI-ADC system 100 in both operation modes. In accordance with the Nyquist-Shannon sampling theorem, a frequency of the analog input signal 101 may be less than or equal to quarter of the maximum sample rate $F_s$ of the TI-ADC system 100 in both operation modes.

In the fourth calibration scheme, the analog input signal 101 is digitized by only the first ADC circuit 110 of the TI-ADC system 100 in the first operation mode, whereas the second ADC circuit 120 of the TI-ADC system 100 is calibrated in the first operation mode. In the second operation mode, the analog input signal 101 is digitized by only the first ADC circuit 110 of the TI-ADC system 100 while the first ADC circuit 110 of the TI-ADC system 100 is simultaneously calibrated using the output of the second ADC circuit 120 as a reference. Therefore, the first calibration scheme may, e.g., be used in systems operating in a FDD mode for input signals up to a maximum frequency of $F_s/4$. The first operation mode of the TI-ADC system 100 may be understood as a reference calibration mode of the TI-ADC system 100, whereas the second operation mode of the TI-ADC system 100 may be understood as a calibration & reception mode of the TI-ADC system 100.

In other words, the first to fourth switches 131, . . . , 134 adopt setting number 7 in the first operation mode so that the analog input signal 101 (e.g. an RF input signal) is fed to the input buffer 181 of the TI-ADC system 100 and the analog calibration signal 102 is fed to the input buffer 182 of the TI-ADC system 100. The output circuit 140 takes the correction parameters from the parameter determination circuit 150 (e.g. determined during a previous operation in the second operation mode, i.e. a previous calibration) and the ADC circuit 110's output in order to generate the corrected digital output signal 141 at the sample rate $F_s/2$. The parameter determination circuit 150 estimates the correction parameters for the output circuit 140 from the ADC circuit 120's output. Further, the first to fourth switches 131, . . . , 134 adopt setting number 8 in the second operation mode so that analog input signal 101 is fed to both input buffer 181 and 182 of the TI-ADC system 100. The analog calibration signal 102 is fed to ground. The output circuit 140 takes the correction parameters from the parameter determination circuit 150 (e.g. determined during the previous operation in the first operation mode, i.e. a previous calibration) and the ADC circuit 110's output in order to generate the corrected digital output signal 141 at the sample rate $F_s/2$. The parameter determination circuit 150 estimates the correction parameters for the output circuit 140 using the output signal of the second ADC circuit 120 as a reference.

By selecting (generating) a suitable analog calibration signal, all TI-ADC mismatches (e.g. gain, DC-offset and timing skew) may be compensated by the above exemplary calibration schemes at once in contrast to conventional approaches using blind background calibration or a parallel full-speed low-resolution ADC as a reference to calibrate the TI-ADC. Blind schemes impose restrictions on the type of input signals for which the compensation (algorithm) works. Further, blind schemes do not handle dynamic conditions well. If a compensation scheme has been adapted for a specific signal, say a carrier at a certain frequency, and then an undesired signal (e.g. a blocker) is added at a different frequency, the compensation scheme does not work or its performance is degraded. In addition, some of the blind schemes are limited to correcting only a subset of the TI-ADC mismatches (e.g. only gain, DC-offset or timing skew) and therefore their performance is worse. With the above exemplary calibration schemes, these disadvantages may be avoided.

In the foregoing, it is referred to a TI-ADC system comprising two ADC circuits. However, it is to be noted that this not limiting the proposed architecture. Optionally, the TI-ADC system may comprise additional ADC circuits. For example, a TI-ADC according to examples may comprise four, eight or sixteen ADC circuits operating at respective sampling rates of $F_s/4$, $F_s/8$ or $F_s/16$. The above operation (calibration) schemes may be applied accordingly. For example, if the TI-ADC system comprises four ADC circuits, the four ADC circuits may be grouped into two pairs and the pairs may each be calibrated as described herein. In another exemplary TI-ADC system comprising four ADC circuits (operating at a sampling rate of $F_s/4$), only two of the ADC circuits may be used for digitalization of an analog signal and be calibrated as described herein, whereas the other two ADC circuits are not used (are inactive). In other words, a TI-ADC according to examples may additionally comprise time-interleaved third and fourth ADC circuits. Accordingly, the switching circuit 130 may be further configured to selectively supply the analog input signal to at least one of the first to fourth ADC circuits or ground, and to selectively supply the analog calibration signal to at least one of the first to fourth ADC circuits or ground.

Although the proposed calibration schemes are described above in connection with FDD and TDD operation of a base station comprising the TI-ADC system 100, the proposed calibration schemes are not limited to this application. The proposed calibration schemes may be used irrespective of whether the TI-ADC system 100 is used in a base station or not. Similarly, the proposed calibration schemes may be used irrespective of whether a system comprising the TI-ADC system 100 operates in a FDD or a TDD mode. The references to the base station operation in a TDD or FDD mode is merely for illustrative purposes and not limiting the proposed architecture.

Figure 2:
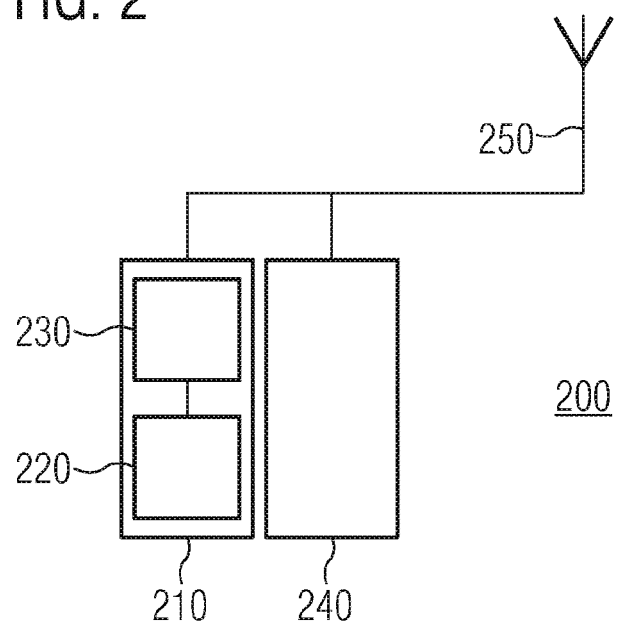
FIG. 2 illustrates an example of a base station.

An example of an implementation using a TI-ADC system according to one or more aspects of the architecture described above in connection with FIG. 1 or one or more examples described above in connection with FIG. 1 is illustrated in FIG. 2. FIG. 2 schematically illustrates an example of a radio base station 200 (e.g. for a femtocell, a picocell, a microcell or a macrocell) comprising a TI-ADC system 220 as proposed.

The TI-ADC system 220 is part of a receiver 210. The receiver 210 additionally comprises analog circuitry 230 configured to receive a RF receive signal from an antenna element 250 of the base station. The analog circuitry 230 is further configured to provide the analog input signal for digitization to the TI-ADC system based on the RF receive signal. For example, the analog circuitry 230 may comprise one or more of a filter, a down-converter (mixer) or a Low Noise Amplifier (LNA).

Further, the base station 200 comprises a transmitter 240 configured to generate a RF transmit signal. The transmitter 240 may use the antenna element 250 or another antenna element (not illustrated) of the base station 200 for radiating the RF transmit signal to the environment.

To this end, a base station using a TI-ADC with low nPSD and/or large SFDR may be provided.

The base station 200 may comprise further elements such as, e.g., a baseband processor, an application processor, memory, a network controller, a user interface, power management circuitry, a satellite navigation receiver, a network interface controller or power tee circuitry.

In some aspects, the application processor may include one or more Central Processing Unit CPU cores and one or more of cache memory, a Low-DropOut (LDO) voltage regulator, interrupt controllers, serial interfaces such as Serial Peripheral Interface (SPI), Inter-Integrated Circuit ($I^2C$) or universal programmable serial interface module, Real Time Clock (RTC), timer-counters including interval and watchdog timers, general purpose Input-Output (TO), memory card controllers such as Secure Digital (SD)/MultiMedia Card (MMC) or similar, Universal Serial Bus (USB) interfaces, Mobile Industry Processor Interface Alliance (MIPI) interfaces and Joint Test Access Group (JTAG) test access ports.

In some aspects, the baseband processor may be implemented, for example, as a solder-down substrate including one or more integrated circuits, a single packaged integrated circuit soldered to a main circuit board or a multi-chip module containing two or more integrated circuits.

In some aspects, the memory may include one or more of volatile memory including Dynamic Random Access Memory (DRAM) and/or Synchronous Dynamic Random Access Memory (SDRAM), and Non-Volatile Memory (NVM) including high-speed electrically erasable memory (commonly referred to as Flash memory), Phase change Random Access Memory (PRAM), Magnetoresistive Random Access Memory (MRAM) and/or a three-dimensional crosspoint (3D XPoint) memory. The memory may be implemented as one or more of solder down packaged integrated circuits, socketed memory modules and plug-in memory cards.

In some aspects, the power management integrated circuitry may include one or more of voltage regulators, surge protectors, power alarm detection circuitry and one or more backup power sources such as a battery or capacitor. Power alarm detection circuitry may detect one or more of brown out (under-voltage) and surge (over-voltage) conditions.

In some aspects, the power tee circuitry may provide for electrical power drawn from a network cable to provide both power supply and data connectivity to the base station using a single cable.

In some aspects, the network controller may provide connectivity to a network using a standard network interface protocol such as Ethernet. Network connectivity may be provided using a physical connection which is one of electrical (commonly referred to as copper interconnect), optical or wireless.

In some aspects, the satellite navigation receiver module may include circuitry to receive and decode signals transmitted by one or more navigation satellite constellations such as the Global Positioning System (GPS), GLObalnaya NAvigatSionnaya Sputnikovaya Sistema (GLONASS), Galileo and/or BeiDou. The receiver may provide data to the application processor which may include one or more of position data or time data. The application processor may use time data to synchronize operations with other radio base stations.

In some aspects, the user interface may include one or more of physical or virtual buttons, such as a reset button, one or more indicators such as Light Emitting Diodes (LEDs) and a display screen.

Figure 3:
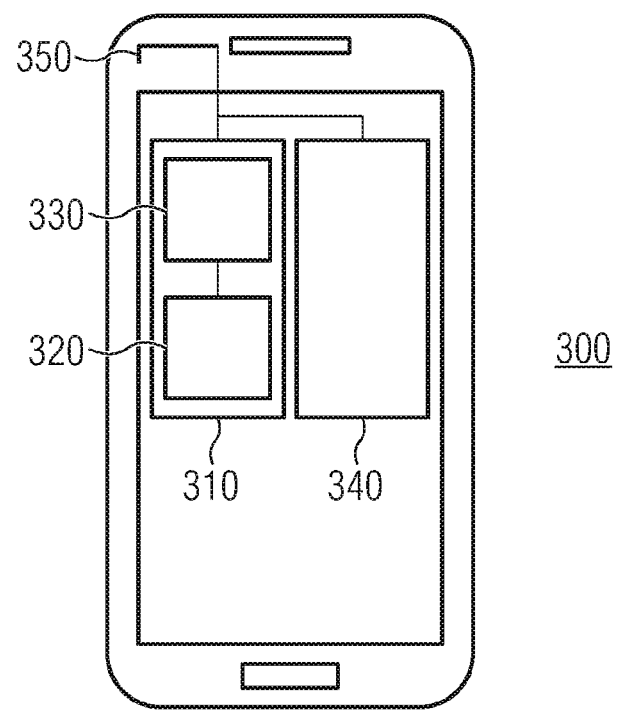
FIG. 3 illustrates an example of a mobile device.

Another example of an implementation using a TI-ADC system according to one or more aspects of the architecture described above in connection with FIG. 1 or one or more examples described above in connection with FIG. 1 is illustrated in FIG. 3. FIG. 3 schematically illustrates an example of a mobile device 300 (e.g. mobile phone, smartphone, tablet-computer, or laptop) comprising a TI-ADC system 320 as proposed.

The TI-ADC system 320 is part of a receiver 310. The receiver 310 additionally comprises analog circuitry 330 configured to receive a RF receive signal from an antenna element 350 of the mobile device. The analog circuitry 330 is further configured to provide the analog input signal for digitization to the TI-ADC system based on the RF receive signal. For example, the analog circuitry 330 may comprise one or more of a filter, a down-converter (mixer) or a LNA.

Further, the mobile device 300 comprises a transmitter 340 configured to generate a RF transmit signal. The transmitter 340 may use the antenna element 350 or another antenna element (not illustrated) of the mobile device 300 for radiating the RF transmit signal to the environment.

To this end, a mobile device using a TI-ADC with low nPSD and/or large SFDR may be provided.

The mobile device 300 may comprise further elements such as, e.g., a baseband processor, memory, a connectivity module, a Near Field Communication (NFC) controller, an audio driver, a camera driver, a touch screen, a display driver, sensors, removable memory, a power management integrated circuit or a smart battery.

In some aspects, the application processor may include, for example, one or more CPU cores and one or more of cache memory, LDO regulators, interrupt controllers, serial interfaces such as SPI, I²C or universal programmable serial interface module, RTC, timer-counters including interval and watchdog timers, general purpose input-output (TO), memory card controllers such as SD/MMC or similar, USB interfaces, MIPI interfaces and JTAG test access ports.

In some aspects, the baseband module may be implemented, for example, as a solder-down substrate including one or more integrated circuits, a single packaged integrated circuit soldered to a main circuit board, and/or a multi-chip module containing two or more integrated circuits.

Figure 4:
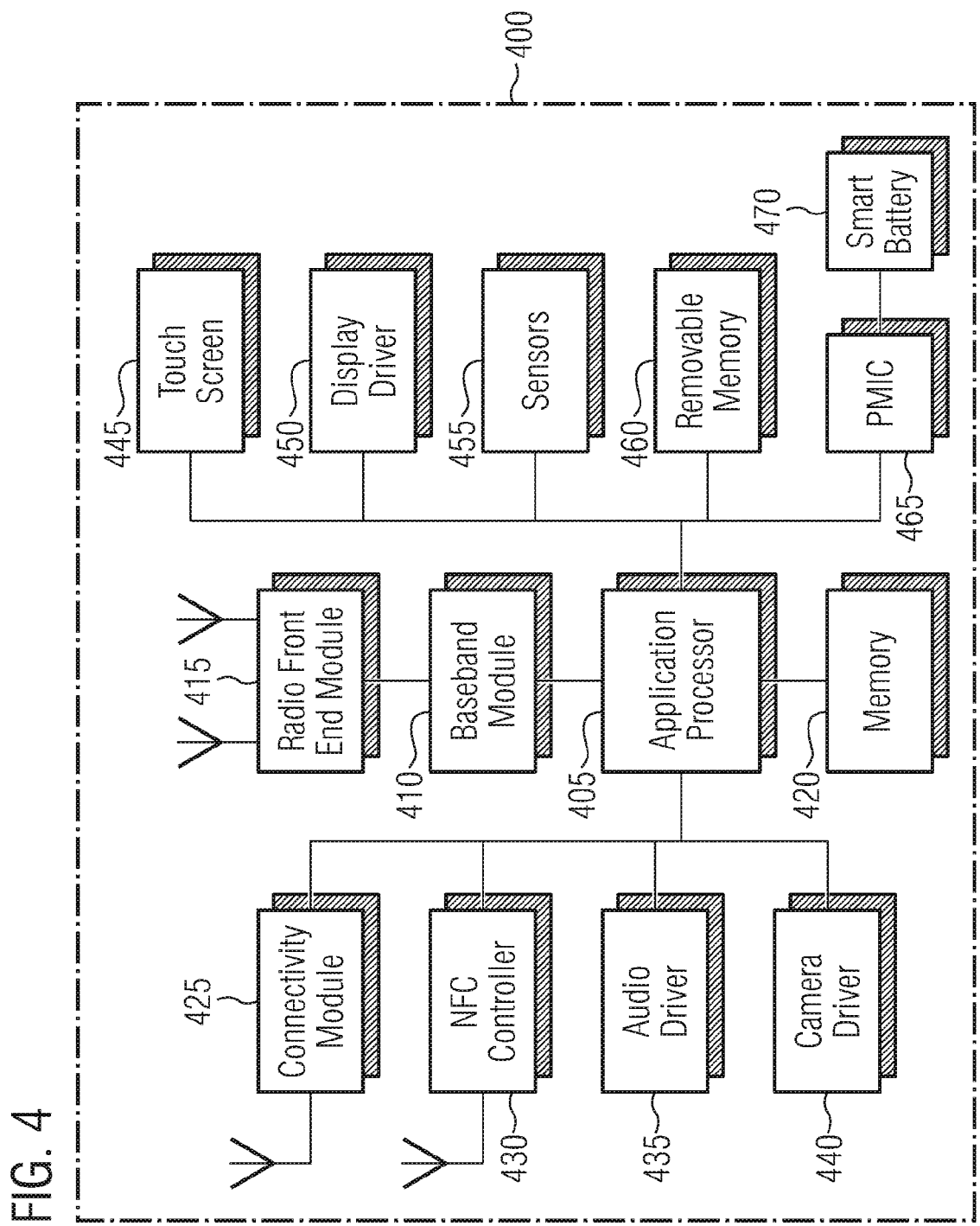
FIG. 4 an example of a mobile device in greater detail.

FIG. 4 schematically illustrates an example of a mobile device in greater detail.

FIG. 4 illustrates a user device 400 in accordance with an aspect. The user device 400 may be a mobile device in some aspects and includes an application processor 405, baseband processor 410 (also referred to as a baseband module), radio front end module (RFEM) 415, memory 420, connectivity module 425, near field communication (NFC) controller 430, audio driver 435, camera driver 440, touch screen 445, display driver 450, sensors 455, removable memory 460, power management integrated circuit (PMIC) 465 and smart battery 470. In some aspects, application processor 405 may include, for example, one or more CPU cores and one or more of cache memory, low drop-out voltage regulators (LDOs), interrupt controllers, serial interfaces such as serial peripheral interface (SPI), inter-integrated circuit (I²C) or universal programmable serial interface module, real time clock (RTC), timer-counters including interval and watchdog timers, general purpose input-output (TO), memory card controllers such as secure digital/multi-media card (SD/MMC) or similar, universal serial bus (USB) interfaces, mobile industry processor interface (MIPI) interfaces and Joint Test Access Group (JTAG) test access ports.

In some aspects, baseband module 410 may be implemented, for example, as a solder-down substrate including one or more integrated circuits, a single packaged integrated circuit soldered to a main circuit board, and/or a multi-chip module containing two or more integrated circuits.

Figure 5:
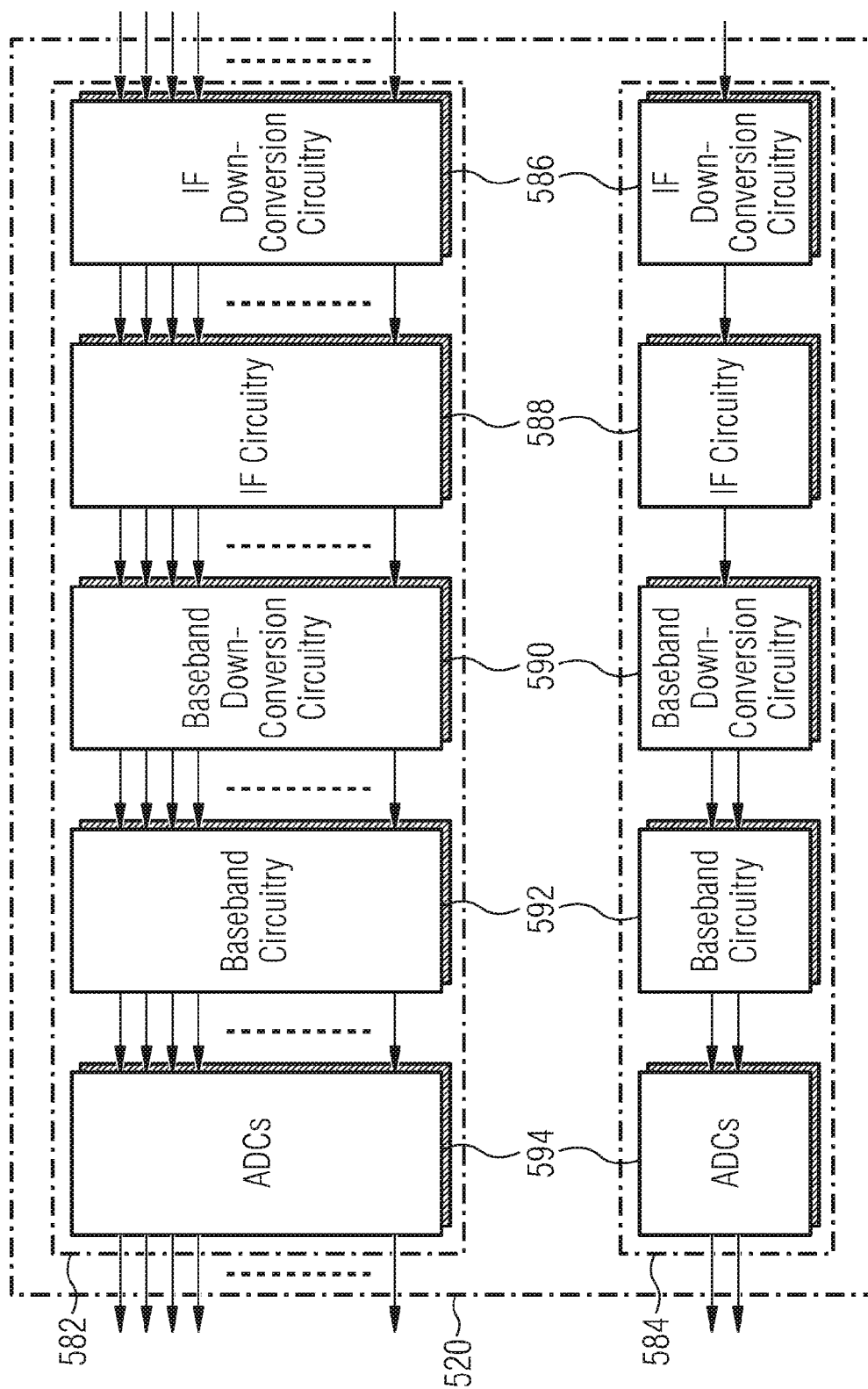
FIG. 5 illustrates an example of receive circuitry of a mobile device.

FIG. 5 schematically illustrates an example of receive circuitry of a mobile device.

FIG. 5 illustrates exemplary receive circuitry 520 according to some aspects. Receive circuitry 520 may include one or more of parallel receive circuitry 582 and/or one or more of combined receive circuitry 584.

In some aspects, the one or more parallel receive circuitry 582 and one or more combined receive circuitry 584 may include one or more Intermediate Frequency (IF) down-conversion circuitry 586, IF processing circuitry 588, baseband down-conversion circuitry 590, baseband processing circuitry 592 and analog-to-digital converter (ADC) circuitry 594. Analog-to-digital converter (ADC) circuitry 594 may comprise an example of a time interleaved analog-to-digital converter system of FIG. 1.

The wireless communication circuits using TI-ADC systems according to the proposed architectures or one or more of the examples described above may be configured to operate according to one of the 3GPP-standardized mobile communication networks or systems. The mobile or wireless communication system may correspond to, for example, a 5G NR, a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolved-UTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples described herein may be summarized as follows:

Example 1 is a TI-ADC system, comprising: time-interleaved first and second ADC circuits; a switching circuit configured to: selectively supply an analog input signal for digitization to at least one of the first ADC circuit, the second ADC circuit or ground; and selectively supply an analog calibration signal to at least one of the first ADC circuit, the second ADC circuit or ground; and an output circuit configured to selectively generate, based on least one of a first digital signal output by the first ADC circuit and a second digital signal output by the second ADC circuit, a digital output signal.

Example 2 is the TI-ADC system of example 1, wherein in a first operation mode: the switching circuit is configured to supply the analog input signal to the first ADC circuit and the second ADC circuit; and the output circuit is configured to generate the digital output signal based on the first digital signal and the second digital signal.

Example 3 is the TI-ADC system of example 2, wherein the switching circuit is configured to supply the analog calibration signal to the first ADC circuit and the second ADC circuit in a second operation mode.

Example 4 is the TI-ADC system of example 3, wherein the switching circuit is configured to supply the analog calibration signal to ground in the first operation mode, and wherein the switching circuit is configured to supply the analog input signal to ground in the second operation mode.

Example 5 is the TI-ADC system of any of examples 2 to 4, wherein the output circuit is configured to generate the digital output signal at a maximum sample rate of the TI-ADC system.

Example 6 is the TI-ADC system of any of examples 2 to 5, wherein a frequency of the analog input signal is less than or equal to half of a maximum sample rate of the TI-ADC system.

Example 7 is the TI-ADC system of example 1, wherein in a first operation mode: the switching circuit is configured to exclusively supply the analog input signal to the first ADC circuit among the time-interleaved first and second ADC circuits; and the output circuit is configured to generate the digital output signal based on only the first digital signal.

Example 8 is the TI-ADC system of example 7, wherein the switching circuit is configured to exclusively supply the analog calibration signal to the first ADC circuit among the time-interleaved first and second ADC circuits in a second operation mode.

Example 9 is the TI-ADC system of example 7 or example 8, wherein the switching circuit is configured to supply the analog calibration signal to ground in the first operation mode, and wherein the switching circuit is configured to supply the analog input signal to ground in the second operation mode.

Example 10 is the TI-ADC system of example 1, wherein in a first operation mode: the switching circuit is configured to supply the analog input signal to the first ADC circuit and the analog calibration signal to the second ADC circuit; and the output circuit is configured to generate the digital output signal based on the first digital signal.

Example 11 is the TI-ADC system of example 10, wherein in a second operation mode: the switching circuit is configured to supply the analog input signal to the second ADC circuit and the analog calibration signal to the first ADC circuit; and the output circuit is configured to generate the digital output signal based on the second digital signal.

Example 12 is the TI-ADC system of example 1, wherein in a first operation mode: the switching circuit is configured to supply the analog input signal to the first ADC circuit and the analog calibration signal to the second ADC circuit; and the output circuit is configured to generate the digital output signal based on the first digital signal.

Example 13 is the TI-ADC system of example 12, wherein in a second operation mode: the switching circuit is configured to supply the analog input signal to the first ADC circuit and the second ADC circuit; and the output circuit is configured to generate the digital output signal based on the first digital signal.

Example 14 is the TI-ADC system of example 13, wherein the switching circuit is configured to supply the analog calibration signal to ground in the second operation mode.

Example 15 is the TI-ADC system of any of examples 7 to 14, wherein the output circuit is configured to generate the digital output signal at about half of a maximum sample rate of the TI-ADC system.

Example 16 is the TI-ADC system of any of examples 7 to 15, wherein a frequency of the analog input signal is less than or equal to quarter of a maximum sample rate of the TI-ADC system.

Example 17 is the TI-ADC system of any of examples 2 to 16, wherein the analog calibration signal is derived from a digital calibration signal representing one or more digital data sequences for calibration.

Example 18 is the TI-ADC system of any of examples 1 to 17, further comprising: a first buffer circuit coupled between the switching circuit and the first ADC circuit; and a second buffer circuit coupled between the switching circuit and the second ADC circuit.

Example 19 is the TI-ADC system of any of examples 1 to 18, further comprising an input node configured to receive the analog input signal.

Example 20 is the TI-ADC system of example 19, wherein the switching circuit comprises: a first switch configured to selectively couple the input node to the first ADC circuit or ground; and a second switch configured to selectively couple the input node to the second ADC circuit or ground.

Example 21 is the TI-ADC system of example 20, further comprising: a first resistive element coupled between the input node and the first switch; and a second resistive element coupled between the input node and the second switch.

Example 22 is the TI-ADC system of any of examples 1 to 21, further comprising a signal node configured to receive the analog calibration signal.

Example 23 is the TI-ADC system of example 22, wherein the switching circuit comprises: a third switch configured to selectively couple the signal node to the first ADC circuit or ground; and a fourth switch configured to selectively couple the signal node to the second ADC circuit or ground.

Example 24 is the TI-ADC system of example 23, further comprising: a third resistive element coupled between the signal node and the third switch; and a fourth resistive element coupled between the signal node and the fourth switch.

Example 25 is the TI-ADC system of any of examples 1 to 24, further comprising a signal generation circuit configured to generate the analog calibration signal.

Example 26 is the TI-ADC system of example 25, wherein the signal generation circuit comprises: a digital calibration circuit configured to generate a digital calibration signal representing one or more digital data sequences for calibration; and an analog signal generation circuit configured to generate the analog calibration signal based on the one or more digital data sequences for calibration.

Example 27 is the TI-ADC system of any of examples 1 to 26, further comprising a parameter determination circuit configured to selectively determine at least one of first correction parameters for the output circuit for correcting the first digital signal and second correction parameters for the output circuit for correcting the second digital signal.

Example 28 is the TI-ADC system of any of examples 1 to 27, further comprising time-interleaved third and fourth ADC circuits, wherein the switching circuit is further configured to selectively supply the analog input signal to at least one of the first to fourth ADC circuits or ground, and to selectively supply the analog calibration signal to at least one of the first to fourth ADC circuits or ground.

Example 29 is a receiver, comprising: a TI-ADC system according to any of examples 1 to 28; and analog circuitry configured to receive a RF receive signal from an antenna element, and to supply the analog input signal for digitization to the TI-ADC system based on the RF receive signal.

Example 30 is the receiver of example 29, wherein a frequency of the analog input signal for digitization is at least 100 MHz.

Example 31 is a base station, comprising: a receiver according to example 29 or example 30; and a transmitter configured to generate a RF transmit signal.

Example 32 is the base station of example 31, further comprising at least one antenna element coupled to at least one of the receiver and the transmitter.

Example 33 is a mobile device, comprising: a receiver according to example 29 or example 30; and a transmitter configured to generate a RF transmit signal.

Example 34 is the mobile device of example 33, further comprising at least one antenna element coupled to at least one of the receiver and the transmitter.

Example 35 is a time-interleaved Analog-to-Digital Converter, ADC, system, comprising: time-interleaved first and second ADC means; means for selectively supplying an analog input signal for digitization to at least one of the first ADC means, the second ADC means or ground; and means for selectively supplying an analog calibration signal to at least one of the first ADC means, the second ADC means or ground; and means for selectively generating, based on least one of a first digital signal output by the first ADC means and a second digital signal output by the second ADC means, a digital output signal.

Example 36 is the TI-ADC system of example 35, wherein in a first operation mode: the means for selectively supplying the analog input signal is configured to supply the analog input signal to the first ADC means and the second ADC means; and the means for selectively generating is configured to generate the digital output signal based on the first digital signal and the second digital signal.

Example 37 is the TI-ADC system of example 36, wherein the means for selectively supplying the analog calibration signal is configured to supply the analog calibration signal to the first ADC means and the second ADC means in a second operation mode.

Example 38 is the TI-ADC system of example 35, wherein in a first operation mode: the means for selectively supplying the analog input signal is configured to exclusively supply the analog input signal to the first ADC means among the time-interleaved first and second ADC means; and the means for selectively generating is configured to generate the digital output signal based on only the first digital signal.

Example 39 is the TI-ADC system of example 38, wherein the means for selectively supplying the analog calibration signal is configured to exclusively supply the analog calibration signal to the first ADC means among the time-interleaved first and second ADC means in a second operation mode.

Example 40 is the TI-ADC system of example 35, wherein in a first operation mode: the means for selectively supplying the analog input signal is configured to supply the analog input signal to the first ADC means; the means for selectively supplying the analog calibration signal is configured to the analog calibration signal to the second ADC means; and the means for selectively generating is configured to generate the digital output signal based on the first digital signal.

Example 41 is the TI-ADC system of example 40, wherein in a second operation mode: the means for selectively supplying the analog input signal is configured to supply the analog input signal to the second ADC means; the means for selectively supplying the analog calibration signal is configured to the analog calibration signal to the first ADC means; and the means for selectively generating is configured to generate the digital output signal based on the second digital signal.

Example 42 is the TI-ADC system of example 35, wherein in a first operation mode: the means for selectively supplying the analog input signal is configured to supply the analog input signal to the first ADC means; the means for selectively supplying the analog calibration signal is configured to the analog calibration signal to the second ADC means; and the means for selectively generating is configured to generate the digital output signal based on the first digital signal.

Example 43 is the TI-ADC system of example 42, wherein in a second operation mode: the means for selectively supplying the analog input signal is configured to supply the analog input signal to the first ADC means and the second ADC means; and the means for selectively generating is configured to generate the digital output signal based on the first digital signal.

Example 44 is the TI-ADC system of any of examples 35 to 43, further comprising means for selectively determining at least one of first correction parameters for the means for selectively generating the digital output signal for correcting the first digital signal and second correction parameters for the means for selectively generating the digital output signal for correcting the second digital signal.

The aspects and features mentioned and described together with one or more of the previously detailed examples and figures, may as well be combined with one or more of the other examples in order to replace a like feature of the other example or in order to additionally introduce the feature to the other example.

Examples may further be or relate to a computer program having a program code for performing one or more of the above methods, when the computer program is executed on a computer or processor. Steps, operations or processes of various above-described methods may be performed by programmed computers or processors. Examples may also cover program storage devices such as digital data storage media, which are machine, processor or computer readable and encode machine-executable, processor-executable or computer-executable programs of instructions. The instructions perform or cause performing some or all of the acts of the above-described methods. The program storage devices may comprise or be, for instance, digital memories, magnetic storage media such as magnetic disks and magnetic tapes, hard drives, or optically readable digital data storage media. Further examples may also cover computers, processors or control units programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A functional block denoted as "means for . . . " performing a certain function may refer to a circuit that is configured to perform a certain function. Hence, a "means for s.th." may be implemented as a "means configured to or suited for s.th.", such as a device or a circuit configured to or suited for the respective task.

Functions of various elements shown in the figures, including any functional blocks labeled as "means", "means for providing a signal", "means for generating a signal.", etc., may be implemented in the form of dedicated hardware, such as "a signal provider", "a signal processing unit", "a processor", "a controller", etc. as well as hardware capable of executing software in association with appropriate software. When provided by a processor, the functions may be provided by a single dedicated processor, by a single shared processor, or by a plurality of individual processors, some of which or all of which may be shared. However, the term "processor" or "controller" is by far not limited to hardware exclusively capable of executing software, but may include DSP hardware, network processor, application specific integrated circuit (ASIC), field programmable gate array (FPGA), read only memory (ROM) for storing software, random access memory (RAM), and non-volatile storage. Other hardware, conventional and/or custom, may also be included.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A time-interleaved Analog-to-Digital Converter, ADC, system, comprising:
   time-interleaved first and second ADC circuits;
   a switching circuit configured to:
      selectively supply an analog input signal for digitization to at least one of the first ADC circuit, the second ADC circuit or ground; and
      selectively supply an analog calibration signal to at least one of the first ADC circuit, the second ADC circuit or ground; and
   an output circuit configured to selectively generate, based on least one of a first digital signal output by the first ADC circuit and a second digital signal output by the second ADC circuit, a digital output signal.

2. The time-interleaved ADC system of claim 1, wherein in a first operation mode:
   the switching circuit is configured to supply the analog input signal to the first ADC circuit and the second ADC circuit; and
   the output circuit is configured to generate the digital output signal based on the first digital signal and the second digital signal.

3. The time-interleaved ADC system of claim 2, wherein the switching circuit is configured to supply the analog calibration signal to the first ADC circuit and the second ADC circuit in a second operation mode.

4. The time-interleaved ADC system of claim 3, wherein the switching circuit is configured to supply the analog calibration signal to ground in the first operation mode, and wherein the switching circuit is configured to supply the analog input signal to ground in the second operation mode.

5. The time-interleaved ADC system of claim 2, wherein the output circuit is configured to generate the digital output signal at a maximum sample rate of the time-interleaved ADC system.

6. The time-interleaved ADC system of claim 2, wherein a frequency of the analog input signal is less than or equal to half of a maximum sample rate of the time-interleaved ADC system.

7. The time-interleaved ADC system of claim 1, wherein in a first operation mode:
   the switching circuit is configured to exclusively supply the analog input signal to the first ADC circuit among the time-interleaved first and second ADC circuits; and
   the output circuit is configured to generate the digital output signal based on only the first digital signal.

8. The time-interleaved ADC system of claim 7, wherein the switching circuit is configured to exclusively supply the analog calibration signal to the first ADC circuit among the time-interleaved first and second ADC circuits in a second operation mode.

9. The time-interleaved ADC system of claim 7, wherein the switching circuit is configured to supply the analog calibration signal to ground in the first operation mode, and wherein the switching circuit is configured to supply the analog input signal to ground in the second operation mode.

10. The time-interleaved ADC system of claim 1, wherein in a first operation mode:
    the switching circuit is configured to supply the analog input signal to the first ADC circuit and the analog calibration signal to the second ADC circuit; and
    the output circuit is configured to generate the digital output signal based on the first digital signal.

11. The time-interleaved ADC system of claim 10, wherein in a second operation mode:

the switching circuit is configured to supply the analog input signal to the second ADC circuit and the analog calibration signal to the first ADC circuit; and the output circuit is configured to generate the digital output signal based on the second digital signal.

12. The time-interleaved ADC system of claim 1, wherein in a first operation mode:

the switching circuit is configured to supply the analog input signal to the first ADC circuit and the analog calibration signal to the second ADC circuit; and the output circuit is configured to generate the digital output signal based on the first digital signal.

13. The time-interleaved ADC system of claim 12, wherein in a second operation mode:

the switching circuit is configured to supply the analog input signal to the first ADC circuit and the second ADC circuit; and the output circuit is configured to generate the digital output signal based on the first digital signal.

14. The time-interleaved ADC system of claim 13, wherein the switching circuit is configured to supply the analog calibration signal to ground in the second operation mode.

15. The time-interleaved ADC system of claim 7, wherein the output circuit is configured to generate the digital output signal at about half of a maximum sample rate of the time-interleaved ADC system.

16. The time-interleaved ADC system of claim 7, wherein a frequency of the analog input signal is less than or equal to quarter of a maximum sample rate of the time-interleaved ADC system.

17. The time-interleaved ADC system of claim 1, further comprising a parameter determination circuit configured to selectively determine at least one of first correction parameters for the output circuit for correcting the first digital signal and second correction parameters for the output circuit for correcting the second digital signal.

18. The time-interleaved ADC system of claim 1, further comprising an input node configured to receive the analog input signal.

19. The time-interleaved ADC system of claim 18, wherein the switching circuit comprises:

a first switch configured to selectively couple the input node to the first ADC circuit or ground; and a second switch configured to selectively couple the input node to the second ADC circuit or ground.

20. The time-interleaved ADC system of claim 19, further comprising:

a first resistive element coupled between the input node and the first switch; and a second resistive element coupled between the input node and the second switch.

21. The time-interleaved ADC system of claim 1, further comprising a signal node configured to receive the analog calibration signal.

22. The time-interleaved ADC system of claim 21, wherein the switching circuit comprises:

a third switch configured to selectively couple the signal node to the first ADC circuit or ground; and a fourth switch configured to selectively couple the signal node to the second ADC circuit or ground.

23. The time-interleaved ADC system of claim 22, further comprising:

a third resistive element coupled between the signal node and the third switch; and a fourth resistive element coupled between the signal node and the fourth switch.

24. A receiver, comprising:

a time-interleaved ADC system according to claim 1; and analog circuitry configured to receive a radio frequency receive signal from an antenna element, and to supply the analog input signal for digitization to the time-interleaved ADC system based on the radio frequency receive signal.

25. A base station, comprising:

a receiver according to claim 24; and a transmitter configured to generate a radio frequency transmit signal.

* * * * *